United States Patent
Vest et al.

(10) Patent No.: US 8,085,063 B2
(45) Date of Patent: Dec. 27, 2011

(54) POWER REGULATOR CIRCUITRY FOR PROGRAMMABLE LOGIC DEVICE MEMORY ELEMENTS

(75) Inventors: William Bradley Vest, San Jose, CA (US); Ping-Chen Liu, Fremont, CA (US); Thien Le, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/950,963

(22) Filed: Nov. 19, 2010

(65) Prior Publication Data
US 2011/0062988 A1    Mar. 17, 2011

Related U.S. Application Data

(62) Division of application No. 11/799,228, filed on Apr. 30, 2007, now Pat. No. 7,859,301.

(51) Int. Cl.
*H03K 19/173*    (2006.01)
(52) U.S. Cl. .......................................... 326/37; 326/40
(58) Field of Classification Search .............. 326/37–41, 326/47; 365/189.09, 185.23
See application file for complete search history.

(56) References Cited

U.S. PATENT DOCUMENTS

| | | | |
|---|---|---|---|
| 5,122,846 A | 6/1992 | Haken | |
| 5,295,111 A | 3/1994 | Tsujimoto | |
| 5,642,315 A | 6/1997 | Yamaguchi | |
| 5,801,551 A | 9/1998 | Lin | |
| 5,920,201 A | 7/1999 | Mehrotra et al. | |
| 6,025,737 A | 2/2000 | Patel et al. | |
| 6,114,843 A | 9/2000 | Olah | |
| 6,232,893 B1 | 5/2001 | Cliff et al. | |
| 6,411,543 B2 | 6/2002 | Narui et al. | |
| 6,433,585 B1 | 8/2002 | Patel et al. | |
| 6,724,222 B2 | 4/2004 | Patel et al. | |
| 6,795,332 B2 | 9/2004 | Yamaoka et al. | |
| 6,897,679 B2 | 5/2005 | Cliff et al. | |
| 6,975,535 B2 * | 12/2005 | Kim et al. | ................. 365/185.09 |
| 7,196,940 B1 | 3/2007 | Vadi et al. | |
| 7,277,351 B2 | 10/2007 | Liu et al. | |
| 7,358,764 B1 * | 4/2008 | Chan et al. | ....................... 326/38 |
| 7,411,853 B2 | 8/2008 | Liu et al. | |
| 7,430,148 B2 | 9/2008 | Liu et al. | |
| 7,548,091 B1 | 6/2009 | Liu | |
| 7,911,826 B1 * | 3/2011 | Liu et al. | ........................ 365/154 |

OTHER PUBLICATIONS

Liu et al., U.S. Appl. No. 11/166,480, filed Jun. 24, 2005.

* cited by examiner

*Primary Examiner* — James H Cho
(74) *Attorney, Agent, or Firm* — Treyz Law Group; G. Victor Treyz; David C. Kellogg

(57) ABSTRACT

Power regulator circuitry for programmable memory elements on programmable logic device integrated circuits is provided. The programmable memory elements may each include a storage element formed from cross-coupled inverters and an address transistor. Address drivers may be used to supply address signals to the address transistors. The power regulator circuitry may include an address power supply circuit that produces a time-varying address power supply voltage to the address drivers and storage element power supply circuits that provide time-varying storage element power supply voltages to the cross-coupled inverters in the storage elements. Unity gain buffers may be used to distribute a reference voltage from a bandgap voltage reference to the power supply circuits. The power supply circuits may use voltage dividers and p-channel metal-oxide-semiconductor control transistors.

3 Claims, 8 Drawing Sheets

POWER REGULATOR CIRCUITRY FOR PROGRAMMABLE LOGIC DEVICE MEMORY ELEMENTS

This application is a division of patent application Ser. No. 11/799,228, filed Apr. 30, 2007, now U.S. Pat. No. 7,859,301, which is hereby incorporated by reference herein in its entirety.

BACKGROUND

This invention relates to power regulator circuitry for powering memory elements, and more particularly, to power regulator circuitry for powering volatile memory elements that have elevated output voltages on integrated circuits such as programmable logic devices.

Integrated circuits often contain volatile memory elements. Typical volatile memory elements are based on cross-coupled inverters (latches) and are used to store data. Each memory element can store a single bit of data.

Volatile memory elements are often used to store configuration data in programmable logic devices. Programmable logic devices are a type of integrated circuit that can be customized in relatively small batches to implement a desired logic design. In a typical scenario, a programmable logic device manufacturer designs and manufactures uncustomized programmable logic device integrated circuits in advance. Later, a logic designer uses a logic design system to design a custom logic circuit. The logic design system uses information on the hardware capabilities of the manufacturer's programmable logic devices to help the designer implement the logic circuit using the resources available on a given programmable logic device.

The logic design system creates configuration data based on the logic designer's custom design. When the configuration data is loaded into the memory elements of one of the programmable logic devices, it programs the logic of that programmable logic device so that the programmable logic device implements the designer's logic circuit. The use of programmable logic devices can significantly reduce the amount of effort required to implement a desired integrated circuit design.

Conventional programmable logic device memory elements are powered at a constant positive power supply voltage. The positive power supply voltage that is used to power conventional programmable logic device memory elements is typically referred to as Vcc or Vcc-core and is the same power supply voltage used to power the core logic in the programmable logic device.

Integrated circuits such as programmable logic device integrated circuits that operate at low values of Vcc offer benefits over integrated circuits that operate at higher values of Vcc. For example, reductions in Vcc generally lead to reduced power consumption. Because of these benefits, the semiconductor industry is continually striving to produce processes and circuit designs that support reductions in Vcc. Previous generations of programmable logic devices operated at Vcc levels of 2.0 volts, 1.8 volts, and 1.5 volts. More recently, Vcc levels of 1.2 volts have been used in programmable logic devices. It is expected that future programmable logic devices will support Vcc levels of less than 1.2 volts (e.g., 1.1 volts or 1.0 volts).

The memory elements in a programmable logic device produce static output signals that reflect the configuration data that has been loaded into the memory elements. The static output signals drive the gates of n-channel and p-channel metal-oxide-semiconductor (MOS) transistors. Some of the transistors such as the n-channel transistors are used as pass transistors and are incorporated into multiplexers and other logic components. P-channel transistors are sometimes used as power-down transistors that prevent power from being applied to unused portions of an integrated circuit.

Both n-channel and p-channel transistors operate poorly when they are driven at insufficient voltages. For example, if the gate of an n-channel pass transistor receives a voltage that is too low, the transistor will not turn on properly and will degrade logic signals passing through the transistor. If the gate of a p-channel power-down transistor is too low, the transistor will not turn off properly and will exhibit an undesirably large leakage current.

Programmable memory element power supply voltages that are elevated with respect to the core logic power supply voltage on a programmable logic device may be used to improve performance. However, powering programmable memory elements with static elevated power supply voltages may adversely affect performance. For example, it may be difficult to load configuration data into such memory elements.

It would be desirable to be able to provide power regulator circuitry that can power programmable memory elements with time-varying power supply voltages.

SUMMARY

In accordance with the present invention, power regulator circuitry is provided for powering programmable memory elements on integrated circuits such as programmable logic device integrated circuits.

The programmable memory elements may each include a storage element formed from cross-coupled inverters, an address transistor, and a clear transistor. Address drivers may be used to supply address signals to the address transistors. The power regulator circuitry may include an address power supply circuit that produces a time-varying address power supply voltage to the address drivers and multiple storage element power supply circuits each of which provides a time-varying storage element power supply voltages to the cross-coupled inverters in the storage elements.

The magnitude of the address power supply voltage that is produced by the address power supply may depend on the mode of operation of the programmable logic device integrated circuit. For example, the address power supply voltage may have a first voltage when the programmable logic device integrated circuit is operated in a configuration mode in which configuration data is loaded into the programmable memory elements and may have a second voltage that is less than the first voltage when the programmable logic device integrated circuit is operated normally in a user mode.

The magnitude of the storage element power supply voltage that is produced by the storage element power supply may also depend on the mode of operation of the programmable logic device integrated circuit. For example, the storage element power supply voltage may have a given voltage when the programmable logic device integrated circuit is operated in a configuration mode in which configuration data is loaded into the programmable memory elements and may have another voltage that is greater than the given voltage when the programmable logic device integrated circuit is operated normally in a user mode.

Unity gain buffers may be used to distribute a reference voltage from a bandgap voltage reference to the address power supply circuit and the storage element power supply circuits. The power supply circuits may use voltage dividers and p-channel metal-oxide-semiconductor control transistors. The voltage dividers may reduce the magnitude of internal feedback signals so that compact operational amplifier circuitry may be used. The p-channel control transistors may help to reduce the area consumed by the power supply circuitry on the programmable logic device.

Further features of the invention, its nature and various advantages will be more apparent from the accompanying drawings and the following detailed description.

DETAILED DESCRIPTION

Figure 1:
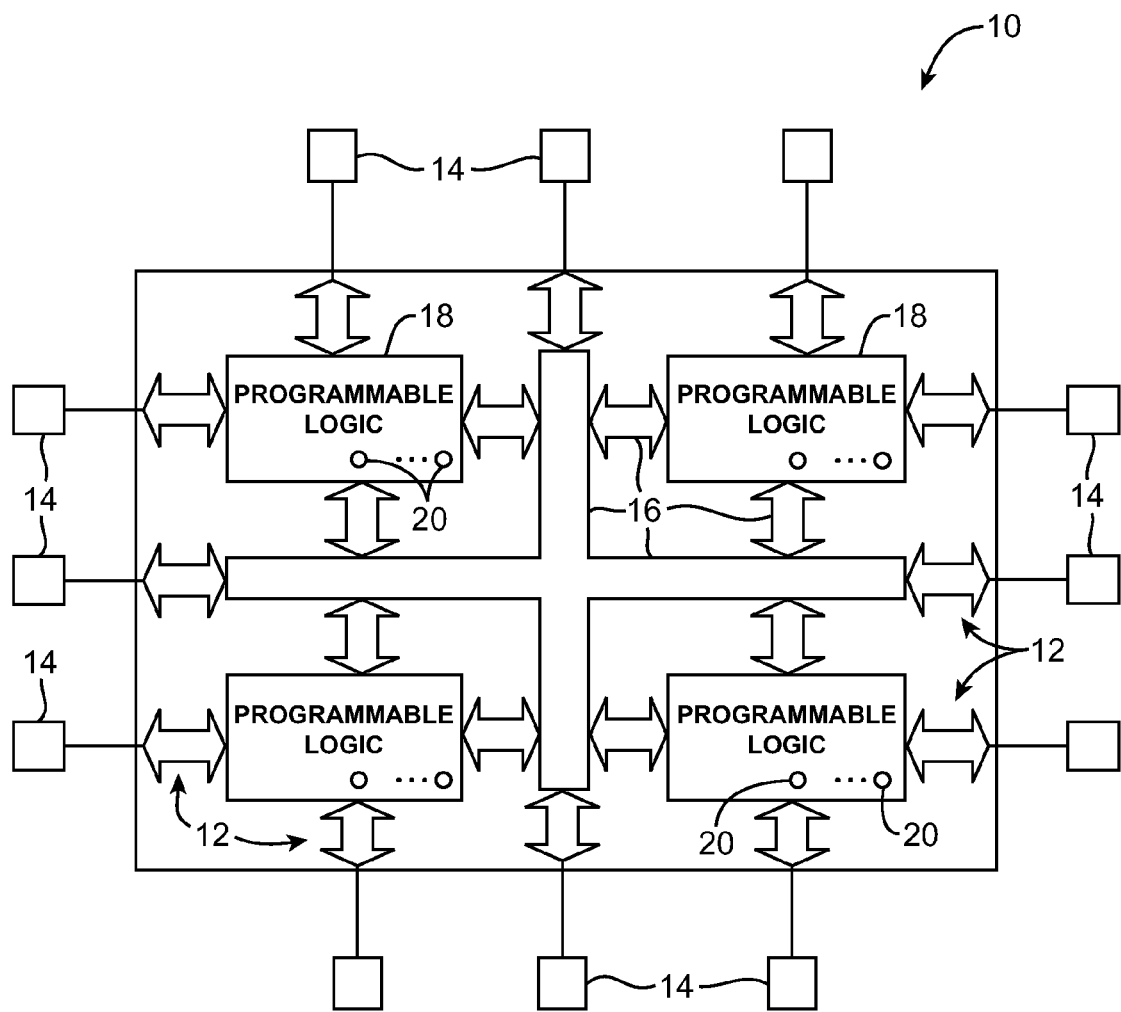
FIG. 1 is a diagram of an illustrative programmable logic device integrated circuit that may have power regulator circuitry for powering programmable logic device memory elements in accordance with an embodiment of the present invention.

The present invention relates to memory elements and integrated circuits that contain memory elements. The invention also relates to power regulator circuitry (power supply circuitry) that produces power supply voltages for the memory elements. The integrated circuits that contain the memory elements and power regulator circuitry may be memory chips, digital signal processing circuits with memory arrays, microprocessors, application specific integrated circuits with memory arrays, programmable logic device integrated circuits in which memory elements are used for configuration memory, or any other suitable integrated circuits. For clarity, the present invention will generally be described in the context of programmable logic device integrated circuits in which programmable logic device memory elements are used to store configuration data and in which the regulator circuitry is used to provide power supply voltages for the memory elements.

During the programming of a programmable logic device, configuration data is loaded into the memory elements. During operation of the programmable logic device, each memory element provides a static output signal. The outputs signals from the memory elements are applied to programmable logic and customize the programmable logic to perform a desired logic function. In a typical arrangement, each static output signal serves as a control signal that is applied to the gate of an n-channel and/or p-channel metal-oxide-semiconductor transistor.

The programmable logic in which the n-channel and p-channel transistors are contained makes up part of the logic core of the programmable logic device and is therefore sometimes referred to as programmable core logic. Core logic is powered using a positive power supply voltage that is generally referred to as Vcc and a ground voltage that is generally referred to as Vss.

To reduce power consumption, there is an ongoing trend in the semiconductor industry to reduce the magnitude of Vcc. Reducing the core logic power supply voltage reduces power consumption, but can lead to design challenges. For example, n-channel transistors in the programmable core logic can be difficult to turn on completely and p-channel transistors in the core logic can be difficult to turn off completely.

In accordance with the present invention, power regulator circuitry (sometimes referred to as power supply circuitry) may be used to produce power supply voltages for the programmable memory elements on a programmable logic device integrated circuit. Each memory element may include a storage element formed from cross-coupled inverters. Each memory element may also include an address transistor and a clear transistor. During configuration data loading operations, the address transistors in the programmable logic device memory elements may be powered at an elevated power supply voltage (e.g., a voltage Vh of 1.6 volts) and the storage elements in the programmable logic device memory elements may be powered at a lower power supply voltage such as Vcc. After the configuration data loading operations are complete, the power regulator circuitry can produce an elevated power supply voltage (e.g., a voltage Vh of 1.6 volts) for powering the storage elements in the programmable logic device memory elements, whereas a lower power supply voltage (e.g., Vcc) may be produced for powering the address transistors.

The power supply voltage that is used to power the address transistors in the programmable logic device memory elements may sometimes be referred to as an address transistor power supply voltage (Vccadd). Any suitable values may be used for the minimum and maximum voltage levels for Vccadd. With one suitable arrangement, the value of Vccadd may range from a low voltage of Vcc (e.g., 1.2 volts) to a high voltage of Vh (e.g., 1.6 volts or another voltage in the range of about 1.5-1.7 volts).

The power supply voltage that is used to power the storage elements in the programmable logic device integrated circuit memory elements is sometimes referred to as a storage element power supply voltage. A programmable logic device integrated circuit may be divided into four quadrants, each of which is powered using an independent version of the storage element power supply voltage. The storage element power supply voltages for the four respective quadrants of a programmable logic device may be referred to as power supply voltages Vcch1, Vcch2, Vcch3, and Vcch4 (generically Vcchx). Any suitable values may be used for the minimum and maximum voltage levels for Vcchx. With one suitable arrangement, the value of Vcchx may range from a low voltage of Vcc (e.g., 1.2 volts) to a high voltage of Vh (e.g., 1.6 volts).

If desired, the storage element power supply voltage Vcchx may have a somewhat lower maximum value (e.g., 1.55 volts) than the maximum value of the address transistor power supply voltage (e.g., 1.6 volts). This type of arrangement may help to increase the reliability of the storage elements. The address transistors are only used during data loading and can therefore generally withstand larger voltages. For clarity, the illustrative 1.55 volt elevated address voltage power supply voltage level and the illustrative 1.6 volt elevated storage element power supply voltage level are generally referred to herein as elevated voltage level Vh.

During programmable logic device memory element loading operations, address transistors are powered using a Vccadd value of Vh. After loading, the programmable logic device enters normal operation (sometimes referred to as user mode). During normal operation, the storage element power supply voltage Vcchx is maintained at a value of Vh. As a result, the memory elements that contain logic ones produce output signals at Vh. The value of Vh is greater than Vcc, so n-channel transistors in the programmable core logic are turned on more fully and p-channel transistors in the programmable core logic are turned off more fully than would be possible if the memory elements were powered at Vcc. This improves overall device performance.

An illustrative programmable logic device 10 that may contain power regulator circuitry in accordance with the present invention is shown in FIG. 1.

Programmable logic device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the memory elements each provide a corresponding static control output signal that controls the state of an associated logic component in programmable logic 18. Typically the memory element output signals are used to control the gates of metal-oxide-semiconductor (MOS) transistors. Most of these transistors are generally n-channel metal-oxide-semiconductor (NMOS) pass transistors in programmable components such as multiplexers. When a memory element output is high, the pass transistor controlled by that memory element is turned on and passes logic signals from its input to its output. When the memory element output is low, the pass transistor is turned off and does not pass logic signals. P-channel metal-oxide-semiconductor (PMOS) transistors may also be controlled by the memory elements.

A typical memory element 20 has a storage element portion that is formed from a number of transistors configured as cross-coupled inverters. With one suitable approach, complementary metal-oxide-semiconductor (CMOS) integrated circuit technology is used to form the memory elements 20, so CMOS-based memory element implementations are described herein as an example. In the context of programmable logic device integrated circuits, the memory elements store configuration data and are therefore sometimes referred to as configuration random-access memory (CRAM) cells.

The memory elements may be loaded from any suitable source. With one illustrative arrangement, the memory elements are loaded from an external erasable-programmable read-only memory and control chip called a configuration device via pins 14 and input/output circuitry 12. The output signals from the loaded memory elements 20 are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc. The memory elements 20 are generally arranged in an array pattern. In a typical modern programmable logic device, there may be millions of memory elements 20 on each chip.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
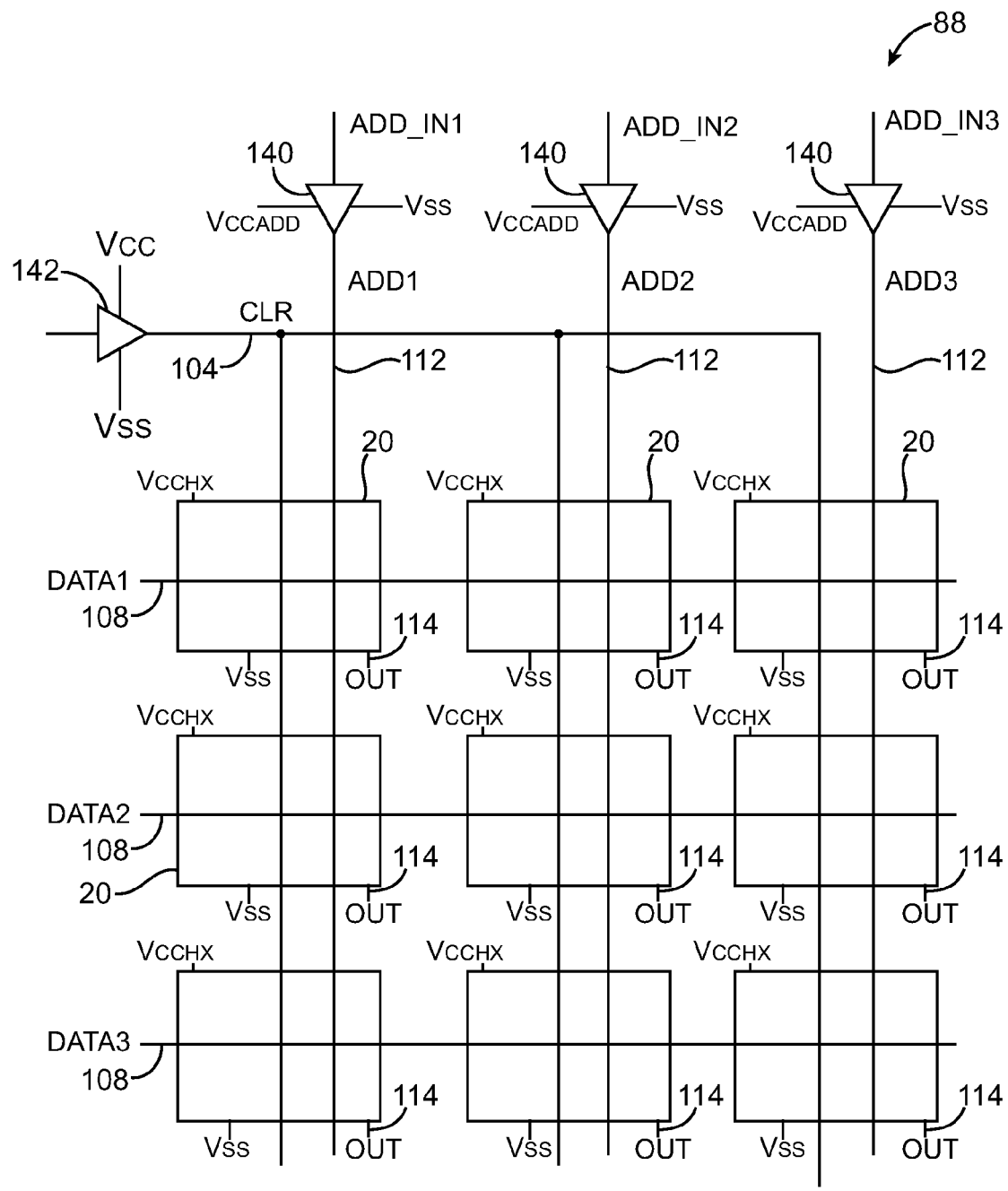
FIG. 2 is a diagram of an array of programmable logic device memory elements that may be powered using power regulator circuitry in accordance with an embodiment of the present invention.

When memory elements are arranged in an array, horizontal and vertical conductors and associated loading circuitry may be used to load the memory elements with configuration data. An illustrative array 88 of memory elements 20 is shown in FIG. 2. Address lines 112 are used to address array 88 as data is conveyed over data lines 108. Each address line 112 may have an associated address line driver 140. Drivers 140 may be powered with positive power supply voltage Vccadd and ground power supply voltage Vss (e.g., 0 volts). Each driver 140 may receive an address signal ADD_IN at its input and may produce a corresponding address signal ADD for one of lines 112 at its output. Configuration data may be loaded into memory elements 20 in array 88 over data lines 108 as appropriate address lines 112 are asserted. A clear signal CLR on clear line 104 may be used to clear the memory elements 20 in preparation for data loading operations. The clear signal CLR may be produced by a clear line driver 142 that is powered using positive power supply voltage Vcc and ground voltage Vss. If desired, array 88 may be cleared by powering up memory elements 20 while clear signal CLR is held high at Vcc. Each memory element 20 produces an output on a corresponding data output line 114.

Programmable logic device 10 contains core logic (e.g., hardwired logic and programmable logic 18 of FIG. 1). The core logic is powered at a positive power supply voltage Vcc and a ground voltage Vss. The power regulator circuitry on device 10 may be powered using core logic power supply voltage Vcc, ground voltage Vss, and additional power supply voltages such as a power supply voltage Vccr (e.g., a power supply voltage Vccr that is larger than Vcc). With one illustrative arrangement, the power supply voltage Vcc is about 1.2 volts, the power supply voltage Vccr is 2.5 volts, and the ground voltage Vss is 0 volts. Other arrangements may be used. For example, Vcc may be greater than or less than 1.2 volts, Vccr may be greater than or less than 2.5 volts, and Vss may be greater than or less than 0 volts. The use of a Vcc value of 1.2 volts, a Vccr value of 2.5 volts, and a Vss value of 0 volts is merely illustrative.

Power supply voltages such as Vcc, Vccr, and Vss may be supplied to circuitry on device 10 using any suitable arrangement. For example, power supply voltages such as Vcc, Vccr, and Vss may be received from one or more external power supply pins. Power supply voltages that are greater or less than the externally-supplied power supply voltages can be generated using on-chip circuitry. For example, a voltage divider may be used to reduce an externally-supplied voltage and a charge pump or other voltage boosting circuit may be used to generate a power supply voltage that is greater than an externally-supplied power supply voltage.

Data loading and reading circuitry on device 10 may be used to provide address, clear, and data signals to array 88. During writing operations, configuration data that is to be loaded into array 88 is supplied to data lines 108. During normal operation (user mode), the signals on output lines 114 are used to control associated programmable logic components.

The core logic on device 10 contains n-channel and p-channel metal-oxide-semiconductor transistors and programmable logic components formed from n-channel and p-channel metal-oxide-semiconductor transistors such as inverters, multiplexers, logic gates, register logic, look-up tables, etc. In a typical scenario, a circuit or component in programmable logic 18 has a positive power supply terminal that receives positive power supply voltage Vcc and a ground power supply terminal that receives ground power supply voltage Vss.

Power regulator circuitry on device 10 supplies ground power supply voltage Vss and positive power supply signals Vccadd and Vcchx to drivers 140 and programmable logic device memory elements 20. During normal operation, the value of Vcchx is greater than Vcc. When the power supply voltage is elevated in this way (i.e., when the difference between the positive power supply voltage Vcchx and the ground voltage is larger than Vcc), the performance of the device 10 is enhanced. In particular, using an elevated power supply voltage makes it possible for the output control signals OUT from the memory elements 20 to more fully turn on n-channel transistors in the core logic of device 10 and to more fully turn off p-channel transistors in the core logic of device 10 than would otherwise be possible.

In general, an elevated power supply voltage may be implemented using an increased positive power supply voltage and/or a decreased ground power supply voltage. The introduction of power supply lines with different voltage levels into a programmable logic device architecture tends to add complexity. To avoid adding unnecessary complexity, it is may be desirable to limit the use of different power supply voltages. One suitable approach for limiting the number of power supply levels is to use the same ground voltage Vss to power array 88 that is used to the core logic and regulator circuitry on device 10. This type of arrangement is described as an example. If desired, however, other arrangements such as those in which the ground voltage for array 88 differs from the ground voltage for core logic 18 or the regulator circuitry may be used.

Power supply voltages Vcchx, Vccadd, and Vss may be distributed to drivers 140 and memory elements 20 in memory element array 88 using any suitable scheme. For example, power supply voltage Vcchx may be distributed to the memory elements in array 88 using a power distribution grid having interconnected columns and rows of power lines. In the example of FIG. 2, there are three rows and three columns of memory elements 20 in array 88. This is merely illustrative. Integrated circuits such as integrated circuit 10 may have any suitable number of memory elements 20. A typical memory array might, as an example, have thousands or millions of memory elements 20 arranged in hundreds or thousands or rows and columns.

The signal Vss is constant. The power supply signals Vcchx and Vccadd preferably vary. For example, signal Vcchx may vary between Vcc during write operations (where the relatively low voltage makes it easier to load data into elements 20) and Vh during read operations (in which the relatively higher voltage makes it easier to ascertain the voltage levels on data lines 108). During normal operation, Vcchx may be equal to Vh to improve the performance of device 10. The power supply signal Vccadd may vary between Vh during write operations (where the increased voltage Vh makes it easier to load data through the address transistors in elements 20) and Vcc during read operations (e.g., when reading data out of array 88 for testing).

Data loading and reading circuitry on device 10 controls clearing and data loading operations for array 88. The data loading and reading circuitry receives configuration data from external sources. In a typical system, configuration data is loaded into a programmable logic device from a memory and data loading circuit. This type of circuit, which is sometimes referred to as a configuration device, loads configuration data into registers within the data loading and reading circuitry. The data loading and reading circuitry produces clear signals on clear path 104 (labeled CLR). Asserting the signal CLR when powering up cells 20 clears the contents of the memory array 88. Clearing operations may be performed upon system power-up or during subsequent reconfiguration operations. After the array has been cleared, the CLR signal is deasserted and the configuration data is loaded.

Configuration data may be loaded into registers in the loading and reading circuitry. The registers may be used to apply the configuration data in parallel to array 88 via the DATA1, DATA2, and DATA3 lines 108. Address decoder circuitry may receive addressing information from an external source and, in response, may systematically assert and deassert desired address lines 112 (i.e., ADD1, ADD2, or ADD3). As the address line in each column is asserted, the data on the data lines 108 is loaded into the memory elements 20 in that column. By addressing each column in this way, the entire array 88 may be loaded with configuration data.

After the array has been loaded, proper data loading can be confirmed by reading out the data that has been programmed into memory elements 20. This operation, which is sometimes referred to as data confirmation, is used to ensure that no errors have occurred during the loading process. If the values of the confirmation data read out from array 88 do not match the values that were used during data loading, an error message may be generated, the loading process can be repeated, or other suitable corrective actions may be taken.

During data read operations, data lines 108 are used as read lines. In particular, the DATA1, DATA2, and DATA3 lines 108 may be used to convey loaded configuration data values from a column of addressed memory elements 20 to registers in the data loading and reading circuitry.

After successful confirmation of the data loading process is complete, the loaded configuration data is used to control the operation of the programmable logic on device 10, so that the device 10 can be used in a system. During normal operation (user mode operation), the output 114 of each memory element 20 produces a corresponding static control signal for controlling the gate of an NMOS transistor such as an NMOS pass transistor, a PMOS transistor such as a PMOS power-down transistor, or other circuit component in the programmable core logic 18 of the programmable logic device 10.

Figure 3:
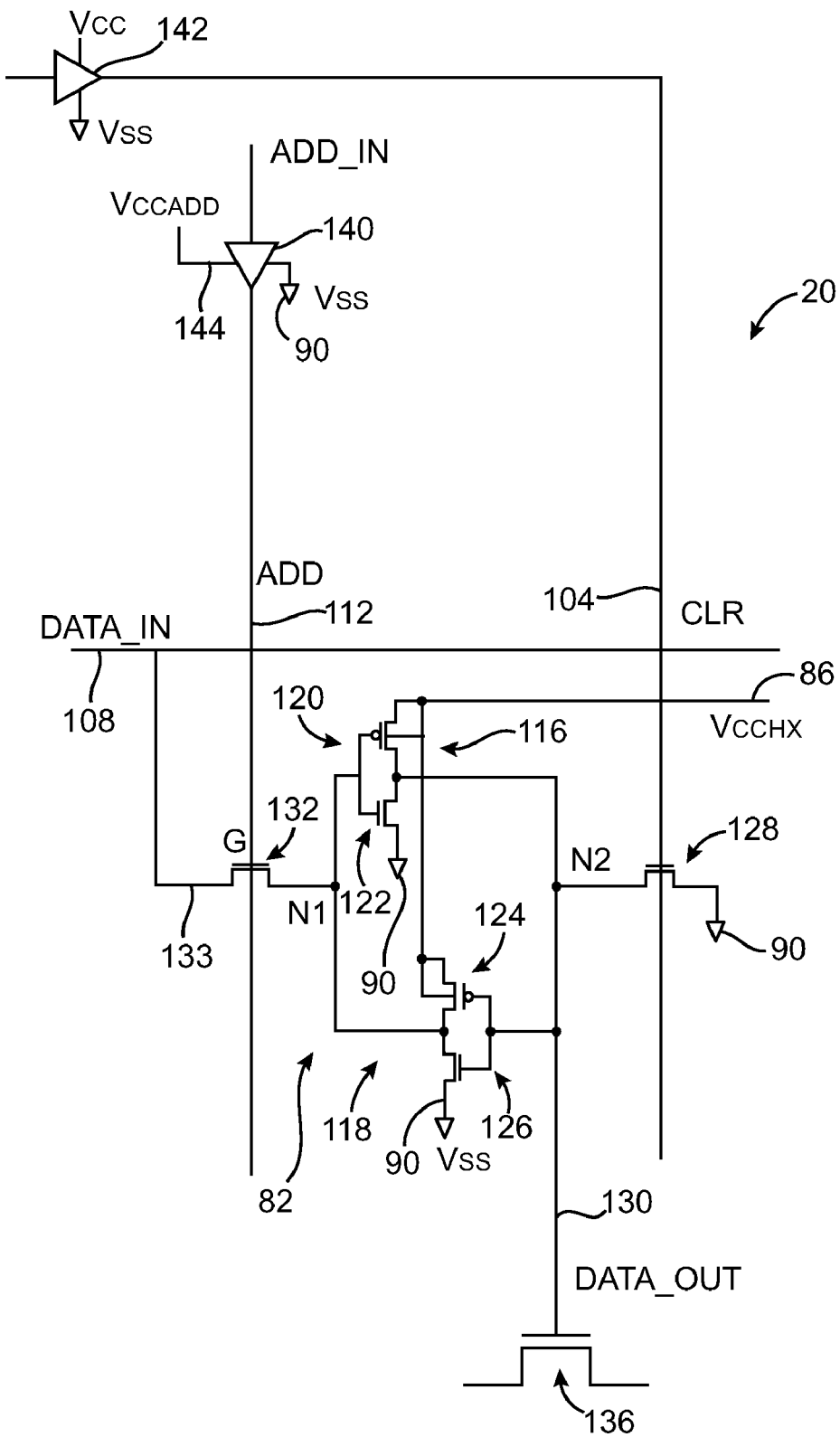
FIG. 3 is a diagram of an illustrative programmable logic device memory element that may be powered using programmable regulator circuitry in accordance with an embodiment of the present invention.

An illustrative memory element 20 is shown in FIG. 3. Memory element 20 may be cleared by asserting the CLR signal on line 104 to turn on clear transistor 128 and thereby connect node N2 to ground terminal 90 as voltage Vcchx is being ramped up.

During programming, memory element 20 receives data on DATA_IN line 108. After data has been loaded into the array, a data confirmation operation is performed to determine whether the data has been loaded properly. During data confirmation operations, the DATA_IN line serves as a verification pathway. When loading, data flows into the array 88 along lines 108. When performing data confirmation operations, data flows from the array 88 into registers in associated data loading and reading circuitry in the opposite direction along lines 108.

During both loading and reading operations, address signals ADD are systematically asserted on address lines 112. This allows the data loading and reading circuitry to address the columns of the array 88 for data writing or reading.

Storage element 82 of memory element 20 is formed from two cross-coupled inverters. Inverter 116 has transistors 120 and 122. Inverter 118 has transistors 124 and 126. Transistors 120 and 124 are p-channel metal-oxide-semiconductor transistors. Transistors 122 and 126 are n-channel metal-oxide-semiconductor transistors. The voltages on nodes N1 and N2 have opposite polarity. When N1 is low, N2 is high and the memory element 20 is said to be programmed. The content of a programmed memory element in this situation is a logic one. When N1 is high and N2 is low, the memory element contains a logic zero and is said to be cleared.

As shown in FIG. 3, the voltage on node N2 is the same as the DATA_OUT voltage. The DATA_OUT signal is applied to programmable core logic components such as transistor 136 over lines such as line 130 (shown as outputs 114 in FIG. 2).

Storage element 82 is powered using positive power supply voltage Vcchx at terminal 86 and ground power supply Vss at ground terminal 90. Address drivers such as address driver 140 are powered using positive power supply voltage Vccadd at terminal 144 and ground power supply Vss at a ground terminal 90. The power regulator circuitry on device 10 provides a power supply voltage Vcchx that has a relatively low magnitude during writing operations and has a relatively high voltage during data confirmation (reading) operations and a power supply voltage Vccadd that has a relatively high voltage during write operations and a relatively low voltage during read operations.

The elevated address voltage used during writing operations (1.6 volts in this example) turns on address transistor 132 more than would otherwise be possible, which reduces the real estate requirements for address transistor 132 and/or increases the write margin for memory element 20. The lowered address voltage used during data confirmation read operations (1.2 volts in this example) increases the read margin of memory element 20.

Figure 4:
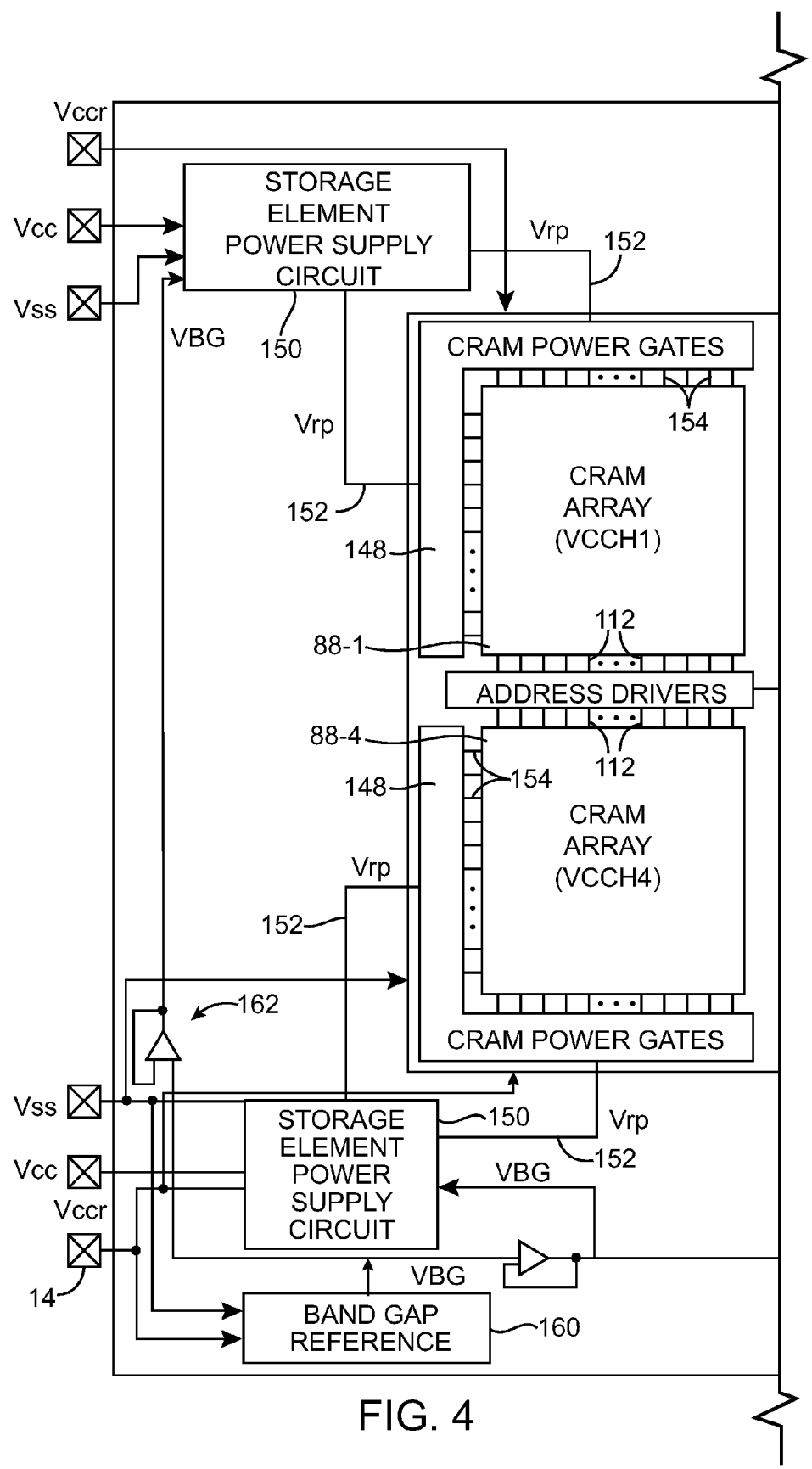
FIG. 4 is a diagram of an illustrative integrated circuit having power regulator circuitry in accordance with an embodiment of the present invention.
Figure 4:
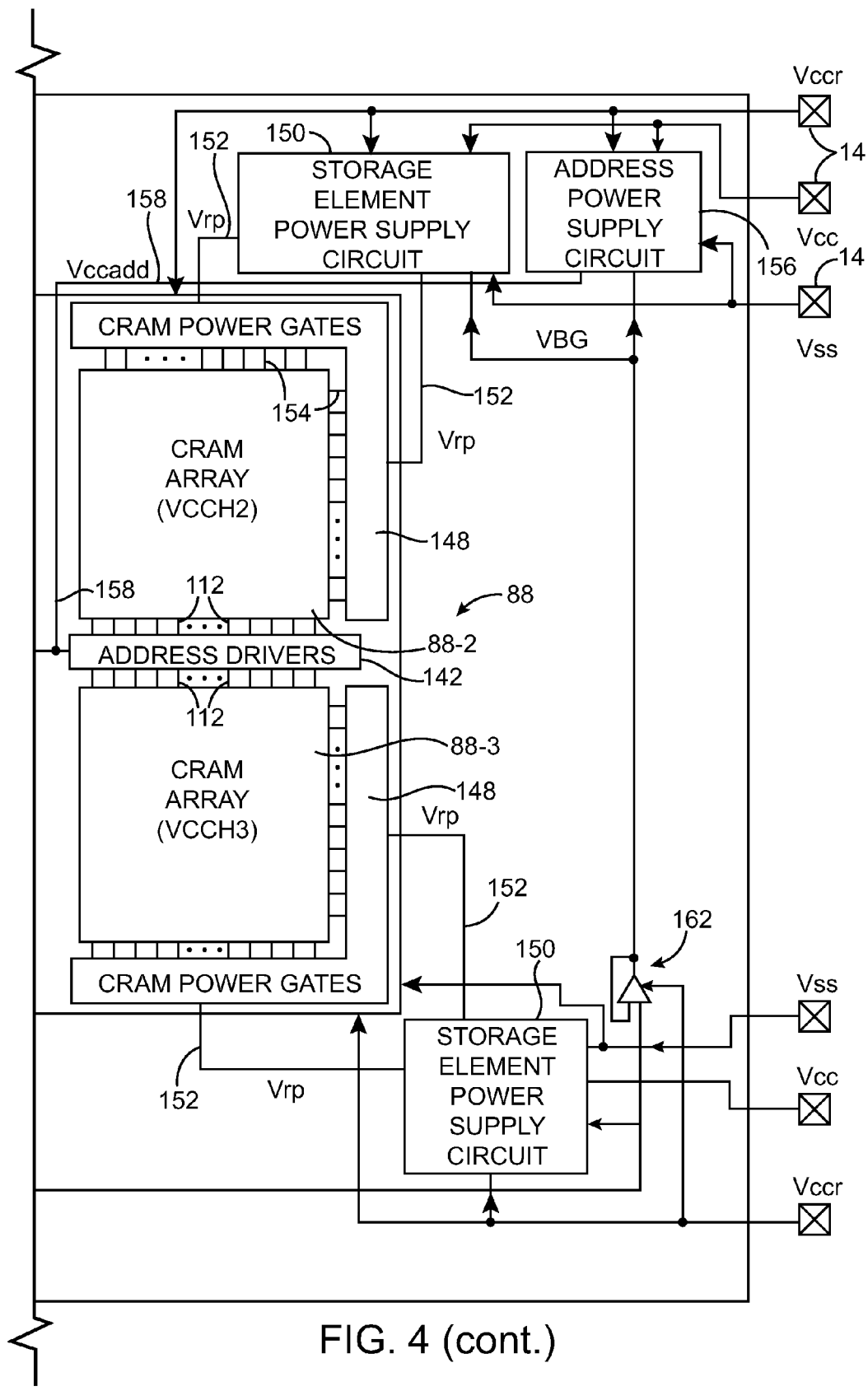

Illustrative power regulator circuitry that may be used to generate the power supply voltages Vcchx and Vccadd for device 10 is shown in FIG. 4. Programmable logic device 10 of FIG. 4 receives power supply signals Vccr, Vcc, and Vss from external sources via pins 14.

Memory array 88 is divided into four subarrays 88-1, 88-2, 88-3, and 88-4. Each subarray receives power from a respective set of transistors 148. Transistors 148 may be parallel metal-oxide-semiconductor (MOS) transistors sources and drains (collectively source-drains) and gates. The use of parallel transistors such as parallel transistors 148 is desirable because this type of arrangement increases transistor drive strength without violating design rules that place a maximum width on individual transistor gate structures. This arrangement also creates a consistent distribution of power across each quadrant, reducing the difference in the Vcchx to each element in the quadrant.

The sources of the transistors 148 that are associated with each subarray are shorted together and are connected to a respective power supply voltage Vccr.

The drains of the transistors 148 that are associated with each subarray are also shorted together. The drains are connected to a grid of power distribution lines which distribute the voltage Vcchx. There is a grid associated with each quadrant of array 88. One grid is associated with subarray 88-1 and is used to distribute voltage Vcch1. Subarrays 88-2, 88-3, and 88-4 have respective associated power distribution grids that are used to distribute voltages Vcch2, Vcch3, and Vcch4. The power distribution grids and the drains of transistors 148 are shown schematically as lines 154 in FIG. 4.

The gates of all of the transistors 148 in each subarray are shorted together and receive a common control signal Vrp from an associated storage element power supply circuit 150 over an associated control path 152. Each circuit 150 also contains an operational amplifier for producing its associated control signal Vrp.

Each storage element power supply circuit 150 may be independently controlled. Because each storage element power supply circuit 150 is exposed to less of the capacitance associated with array 88 than would be experienced by a single larger power supply circuit, stability is improved. Circuit simulations have shown that circuit stability is improved in circuits 150 because the output load pole in each circuit's feedback system is moved farther from its dominant pole, thereby improving system phase margin. In an arrangement of the type shown in FIG. 4 in which each circuit 150 is only associated with a portion of array 88, the load on the operational amplifier in each circuit 150 is reduced because each operational amplifier drives a reduced number of transistors 148. The lines 152 are not shorted together between quadrants, so variations in the operating point of each circuit 150 can arise without affecting the other circuits 150. The amount of current load that is handled by each circuit 150 is therefore balanced and the reaction time of the power regulator circuitry is improved.

The address power supply voltage Vccadd is produced by address power supply circuit 156. Voltage Vccadd is distributed to address drivers 142 via power distribution path 158. In the example of FIG. 4, there is a single row of address drivers 142. Each column of array 88 may have an associated address driver 142. If desired, multiple rows of address drivers 142 may be provided to increase responsiveness in large arrays 88. The address power supply circuit 156 may be controlled separately from storage element power supply circuits 150. By reducing undesirable coupling between circuits 150 and circuit 156, this independent control arrangement may help to improve circuit responsiveness and accuracy.

Power supply circuits 150 and 156 may produce power supply voltages Vccadd and Vcchx using a stable reference voltage VBG. The reference voltage VBG may be produced by any suitable voltage reference. With one suitable arrangement, the reference voltage VBG is produced by a bandgap reference circuit 160. There may be any suitable number of bandgap reference circuits 160 on device 10. In the illustrative arrangement shown in FIG. 4, a single bandgap reference circuit 160 produces a reference voltage VBG that is shared by all four storage element power supply circuits 150 and by address power supply circuit 156. The use of a single bandgap reference circuit 160 may be advantageous because this reduces the amount of circuit real estate that is consumed on device 10 by the reference circuitry, and additionally reduces the amount of standby power consumed by the chip. Unity gain operational amplifier drivers 162 may be used to strengthen the signal VBG for distribution to remote portions of device 10 (e.g., address power supply circuit 156) without altering the magnitude of VBG. Unity gain buffers 162 may exhibit slight variations in performance, but the potential for inaccuracies due to these performance variations is generally outweighed by the space-saving potential of using only a single bandgap reference circuit.

Figure 5:
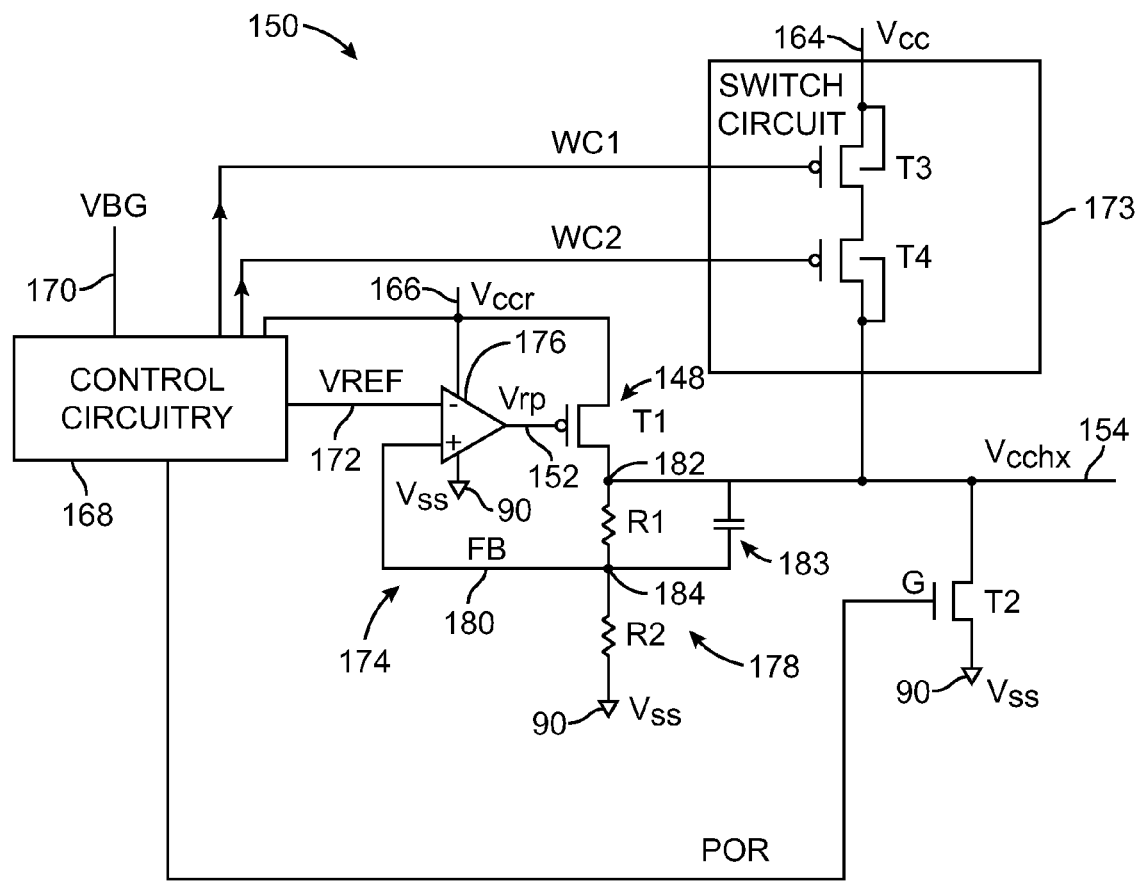
FIG. 5 is a diagram of illustrative power regulator circuitry that may be used to produce a power supply voltage for powering cross-coupled inverters in programmable logic device memory elements in accordance with an embodiment of the present invention.

An illustrative storage element power supply circuit 150 is shown in FIG. 5. As shown in FIG. 5, circuit 150 may have ground terminals 90. Positive power supply voltage Vcc may be supplied to terminal 164 from a power supply pin. Positive power supply voltage Vccr may be received at positive power supply terminal 166. The reference voltage VBG may be received by control circuitry 168 via path 170.

Control circuitry 168 may generate control signals WC1 and WC2 for controlling switch circuit 173. Switch circuit 173 may have PMOS transistors T3 and T4. Control signal WC1 may be provided to the gate of transistor T3. Control signal WC2 may be provided to the gate terminal of transistor T4. Transistors T3 and T4 may be connected in series between positive power supply Vcc and output 154. Output 154 is connected to a power distribution grid and supplies the power supply voltage Vcchx to an associated subarray of memory elements in array 88. When the desired output voltage level for Vcchx is Vcc and a large current capability for circuit 150 is desired, controller 168 may turn on transistors T3 and T4 to short output 154 to the power supply pin that is supplying Vcc to terminal 164.

Transistor T2 is a power-on-reset pull-down transistor. Gate terminal G of transistor T2 is supplied with the power-on-reset signal POR from control circuitry 168. Control circuitry 168 may contain power-on-reset circuitry that detects when the power supply voltages that are being applied to device 10 from external sources have reached their desired levels. For example, control circuitry 168 may determine when signals such as Vcc and Vccr have attained sufficient magnitudes to allow the circuitry on device 10 to operate properly. The power-on-reset signal POR may be held high while the power supply signals are ramping up. In this situation, transistor T2 is on and pulls power supply voltage Vcchx on output line 154 to a known value (ground signal Vss). Once the power-on-reset circuitry determines that the power supply voltages have risen sufficiently, the signal POR may be taken low (e.g., to Vss). This turns off transistor T2 and allows Vcchx to rise.

Control circuitry 168 uses reference voltage VBG from path 170 to generate accurate values of VREF on path 172. The value of VREF is different at different times. For example, VREF may have one value during power-up operations and may have another value during normal operations (user mode).

Storage element power supply circuit 150 may have an operational amplifier 176 and other control circuitry 174 that receives the various values of the voltage VREF on path 172 and provides corresponding values of power supply voltage Vcchx on output path 154. Control circuitry 174 includes a control transistor T1. Transistor T1 is preferably implemented using multiple parallel transistors 148, as described in connection with FIG. 4. This allows transistor T1 to carry sufficient current for powering the memory elements 20 in an associated subarray of array 88.

The gate of transistor T1 (i.e., the gates of the parallel transistors 148 of FIG. 4) receives the control signal Vrp from operational amplifier 176 over path 152. Transistor T1 is connected in series with a voltage divider 178 between positive power supply terminal 166 and ground terminal 90. The values of resistors R1 and R2 in voltage divider 178 may be selected to reduce the magnitude of the feedback voltage FB on node 184 and feedback line 180 relative to the power supply voltage Vcchx on node 182 and path 154. With one suitable arrangement, resistors R1 and R2 have the same resistance R. In this configuration, the magnitude of feedback signal FB is half of the voltage Vcchx. The range of voltages that are typically presented on path 180 will therefore be about 100 mV (when Vcchx is 200 mV) to 0.8 volts (when Vcchx is 1.6 volts), rather than being 200 mV to 1.6 volts. The use of voltage divider 178 to reduce the magnitude of signal FB allows operational amplifier 176 to handle a wide voltage range without resorting to complex and bulky circuits. With one suitable arrangement, operational amplifier 176 may be based on a single PMOS sense pair.

Transistor T1 is preferably a PMOS transistor. An advantage of using a PMOS arrangement for the parallel transistors 148 that make up transistor T1 is that this allows the overall size of the power regulator circuitry to be reduced. Although NMOS designs might exhibit superior noise rejection, PMOS transistors can be manufactured using less circuit real estate without being subject to undesirable punch-through effects.

Compensation capacitor 183 may be used to help stabilize the operation of circuit 150.

Path 180 forms a feedback loop in circuitry 174. When the voltage FB on node 182 rises above a desired value of Vcchx, the voltage on feedback node 184 in voltage divider 178 will rise above VREF. Operational amplifier 176 compares the voltages on its positive and negative inputs and produces a corresponding control signal Vrp on its output.

When feedback signal FB rises above VREF, the control signal Vrp is increased by operational amplifier 176. The control signal Vrp is applied to the gate of transistor T1. Because transistor T1 is a PMOS transistor, the increasing control signal voltage Vrp on its gate results in an increase in the source-drain resistance of transistor T1. As the resistance of transistor T1 increases, the magnitude of the voltage at node 182 (power supply voltage Vcchx) and the magnitude of the voltage at node 184 (feedback voltage FB) are reduced until FB is less than VREF and Vcchx has reached its desired voltage level.

When power supply signal Vcchx falls below its desired set point, the feedback signal FB will fall below VREF. When feedback signal FB falls below VREF, operational amplifier 176 will decrease the control voltage Vrp at the gate of transistor T1. This will decrease the resistance of transistor T1. As the resistance of transistor T1 decreases, the power supply voltage Vcchx will rise to its desired level and the feedback signal FB will rise to VREF.

Control circuitry 168 changes the value of VREF in real time depending on the operating mode of programmable logic device 10. This causes the operational amplifier 176 and other circuitry 174 to produce desired values of the power supply voltage Vcchx at output 154. When needed during power-on-reset operations and other modes of operation, control circuitry 168 generates control signals WC1 and WC2 to activate switch 172 and generates a POR signal to control transistor T2.

Figure 6:
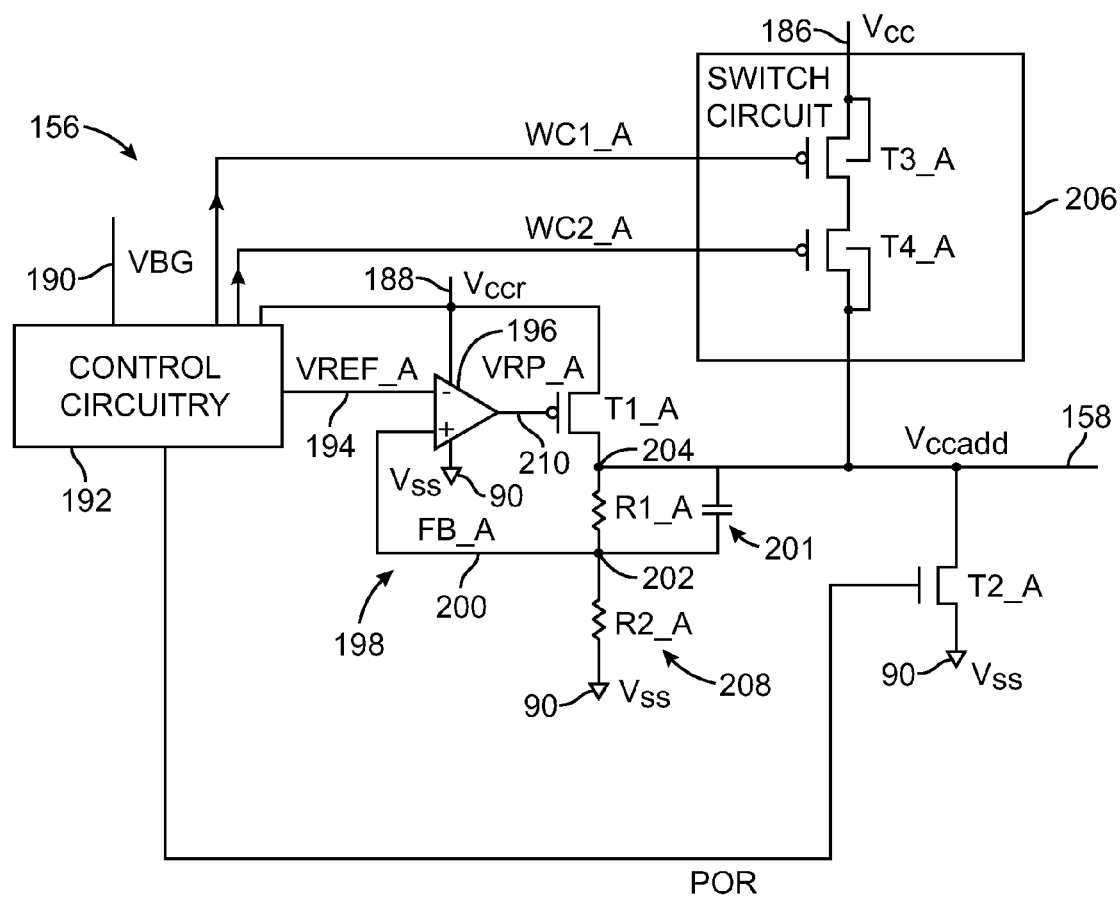
FIG. 6 is a diagram of illustrative power regulator circuitry that may be used to produce a power supply voltage for powering programmable logic device memory element address transistors in programmable logic device memory elements in accordance with an embodiment of the present invention.

An illustrative address power supply circuit 156 is shown in FIG. 6. Circuit 156 may have ground terminals 90. Positive power supply voltage Vcc may be supplied to terminal 186 from a power supply pin. Positive power supply voltage Vccr may be received at positive power supply terminal 188. The reference voltage VBG may be received by control circuitry 192 via path 190.

Control circuitry 192 may generate control signals WC1_A and WC2_A for controlling switch circuit 206. Switch circuit 206 may have PMOS transistors T3_A and T4_A. Control signal WC1_A may be provided to the gate of transistor T3_A. Control signal WC2_A may be provided to the gate terminal of transistor T4_A. Transistors T3_A and T4_A may be connected in series between positive power supply voltage Vcc and output 158. Output 158 supplies the power supply voltage Vccadd to address drivers 142 (FIG. 4). When the desired output voltage level for Vccadd is Vcc and a large current capability for circuit 156 is desired, controller 192 may turn on transistors T3_A and T4_A to short output 158 to the power supply pin that is supplying power supply voltage Vcc to terminal 186.

Transistor T2_A is a power-on-reset pull-down transistor. Gate terminal G of transistor T2_A is supplied with the power-on-reset signal POR from control circuitry 192. Control circuitry 192 may contain power-on-reset circuitry that detects when the power supply voltages that are being applied to device 10 from external sources have reached their desired levels. For example, control circuitry 192 may determine when signals such as Vcc and Vccr have attained sufficient magnitudes to allow the circuitry on device 10 to operate properly. The power-on-reset signal POR may be held high while the power supply signals are ramping up. In this situation, transistor T2_A is on and pulls power supply voltage Vccadd on output line 158 to a known value (ground signal Vss). Once the power-on-reset circuitry determines that the power supply voltages have risen sufficiently, the signal POR may be taken low (e.g., to Vss). This turns off transistor T2_A and allows Vccadd to rise. The signal POR in circuit 156 and the signal POR in circuit 150 (FIG. 5) may be provided by separate power-on-reset circuits or by a shared power-on-reset circuit. The power-on-reset circuitry on device 10 is shown as being part of control circuits 192 and 168 in FIGS. 5 and 6 but may, if desired, be separate from the storage element and address power supply circuits.

Control circuitry 192 of FIG. 6 uses reference voltage VBG from path 190 to generate accurate values of VREF_A on path 194. The value of VREF_A is different at different times. For example, VREF_A may have one value during configuration data loading operations and another value during normal operation (user mode).

Address power supply circuit 156 may have an operational amplifier 196 and other control circuitry 198 that receives the various values of the voltage VREF_A on path 194 and provides corresponding values of power supply voltage Vccadd on output path 158. Control circuitry 198 includes a control transistor T1_A. Transistor T1_A may be implemented using a single transistor or multiple parallel transistors.

The gate of transistor T1_A receives the control signal Vrp_A from operational amplifier 196 over path 210. Transistor T1_A is connected in series with a voltage divider 208 between positive power supply terminal 188 and ground terminal 90. The values of resistors R1_A and R2_A in voltage divider 208 may be selected to reduce the magnitude of the feedback voltage FB_A on node 202 and feedback line 200 relative to the power supply voltage Vccadd on node 204 and path 158. With one suitable arrangement, resistors R1_A and R2_A have the same resistance R, so that the magnitude of feedback signal FB_A is half of the voltage Vccadd. This reduces the range of voltages that are presented to operational amplifier 196 on path 200 and allows compact circuitry to be used in operational amplifier 196. For example, operational amplifier 196 may be formed based on a single PMOS sense pair. Transistor T1_A is preferably a PMOS transistor to minimize the size of the address power supply circuit 156.

Compensation capacitor 201 may be used to help stabilize the operation of circuit 156.

Path 200 forms a feedback loop in circuitry 198. When the voltage on node 204 rises above a desired value of Vccadd, the voltage on feedback node 202 in voltage divider 208 will rise above VREF_A. Operational amplifier 196 compares the voltages on its positive and negative inputs and produces a corresponding control signal Vrp_A on its output.

When Vccadd rises above its desired set point, the feedback signal FB_A will rise above the value of VREF_A that is being produced by control circuitry 192. When feedback signal FB_A rises above VREF_A, the control signal Vrp_A that is produced by operational amplifier 196 increases. The control signal Vrp_A is applied to the gate of transistor T1_A. Because transistor T1_A is a PMOS transistor, the increasing control signal voltage Vrp_A on its gate results in an increase in the source-drain resistance of transistor T1_A. As the resistance of transistor T1_A increases, the magnitude of the voltage at node 204 (power supply voltage Vccadd) and the magnitude of the voltage at node 202 (feedback voltage FB_A) are reduced until FB_A is less than VREF_A.

When power supply signal Vccadd falls below its desired set point, the feedback signal FB_A will fall below VREF_A. When feedback signal FB_A falls below VREF_A, operational amplifier 196 will decrease the control voltage Vrp_A at the gate of transistor T1_A. This will decrease the resistance of transistor T1_A. As the resistance of transistor T1_A decreases, the power supply voltage Vccadd will rise to its desired level and the feedback signal FB_A will rise to VREF_A.

Control circuitry 192 changes the value of VREF_A in real time depending on the operating mode of programmable logic device 10. This causes the operational amplifier 196 and other circuitry 198 to produce desired values of the power supply voltage Vccadd at output 154. When needed during power-on-reset operations and other modes of operation, control circuitry 192 generates control signals WC1_A and WC2_A to activate switch 206 and generates a POR signal to control transistor T2_A.

Figure 7:
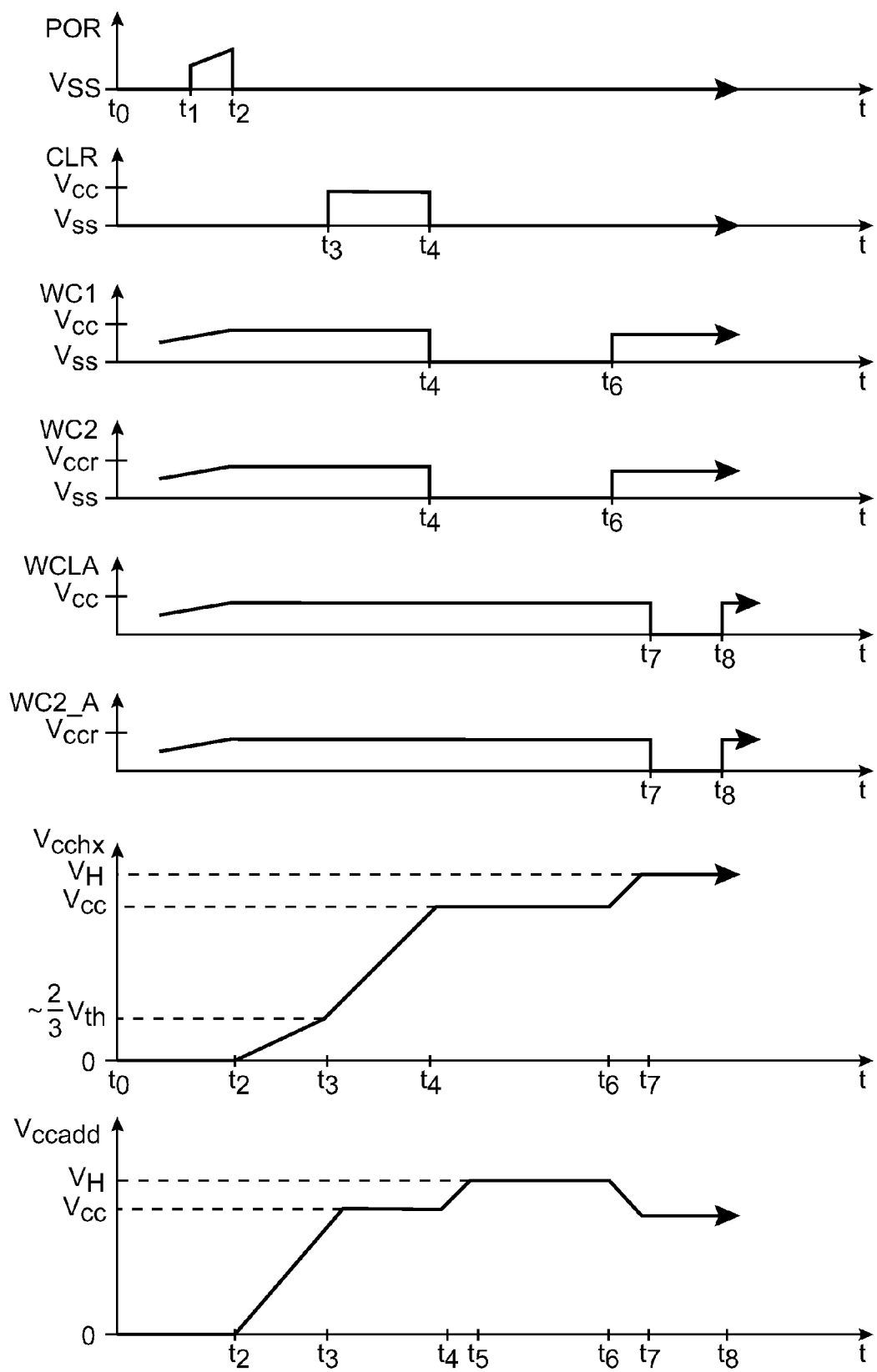
FIG. 7 is a timing diagram showing how power regulator circuitry of the type shown in FIGS. 4, 5, and 6 may be used to provide power supply voltages for programmable logic device memory elements in accordance with an embodiment of the present invention.

A diagram showing how the power regulator circuitry made up of storage element power supply circuits 150 and address power supply circuit 156 can vary power supply voltages Vcchx and Vccadd as a function of the operating mode of programmable logic device integrated circuit 10 is shown in FIG. 7. There are four modes of operation for device 10: (1) power-up mode, (2) clear mode, (3) configuration (write) mode, and (4) user mode (normal operation).

During power-up mode, power-on-reset circuitry on device 10 monitors the power supply signals that are received by device 10. When all of the power supply voltages have reached their desired levels, the power-on-reset circuitry may take the power-on-reset signal POR from high to low. As shown in the POR trace of FIG. 7, power-on-reset signal POR ramps up at times after t1 (when the power-on-reset circuitry activates) and goes low at time t2 when all of the power supply voltages have reached their desired levels.

Between time t2 and t3, device 10 transitions from power-up mode to clear mode. During this transition period, the power regulator circuitry prepares storage element power supply voltage Vcchx and address power supply voltage Vccadd for upcoming clear operations. Power supply circuits 150 ramp voltages Vcch1, Vcch2, Vcch3, and Vcch4 from Vss to about ⅔ of Vth, where Vth is the threshold voltage associated with the PMOS transistors 120 and 124 of storage element 82 (FIG. 3). The value of Vth is typically about 300 mV, so ⅔ of Vth is typically about 200 mV. Ramping voltages Vcch1, Vcch2, Vcch3, and Vcch4 to ⅔ of Vth places the inverters 116 and 118 of storage element 82 in a state in which they are unlikely to experience latchup during a reconfiguration operation (i.e., when entering configuration mode following user mode operations).

The way in which latchup is prevented during reconfiguration operations may be understood by comparison to conventional approaches. Conventionally, the storage element PMOS transistors in a memory cell are powered down to 0 volts prior to reconfiguration. Prior to reconfiguration, a conventional memory element might be storing a logic one. In this situation, the output voltage of the memory element will be high (e.g., 1.2 volts). As the power supply voltage to the memory element drops, charge leaks off of the output node. The voltage of the output node therefore also drops. This continues until the power supply voltage and the output node voltage reach one transistor threshold voltage (about 0.3 volts). At this point the PMOS transistors in the memory element inverters turn off and the output voltage can no longer drop. As a result, when the power supply voltage reaches 0 volts, there is a 0.3 volt charge trapped on the output. This can potentially cause a latchup condition, because the voltage on the drain of a PMOS transistor is much greater than the voltage on its body terminal (i.e., 0.3 volts>>0 volts).

With the present invention, the power supply voltage Vcchx for the inverters 116 and 118 in storage element 82 is taken no lower than 0.2 volts (⅔ of the transistor threshold voltage Vth of 0.3 volts). This places the PMOS inverter transistors in a state where the body terminal of the PMOS transistors is at 0.2 volts and the drains of the PMOS transistors are at 0.3 volts. Because the PMOS transistor drain voltage (0.3 volts) is only slightly larger than the PMOS transistor body voltage (0.2 volts), latchup is unlikely to occur. If desired, latchup may be prevented by taking the power supply voltage Vcchx for the inverters 116 and 118 in storage element 82 no lower than about 0.5 to 0.75 of Vth (e.g., about 0.15 volts to about 0.225 volts).

This latchup prevention operation is not necessary during the initial power-up sequence for device 10, but rather is used to prevent latchup during subsequent reconfiguration operations (i.e., when new configuration data is loaded into a programmable logic device 10 after device 10 is already operating in the field with an existing set of configuration data).

As the power supply voltage Vcchx is being ramped from 0 to ⅔ of Vth, the address power supply circuit 156 ramps up the power supply voltage Vccadd from ground voltage Vss to power supply voltage Vcc. This powers the address line drivers 140. Read/write circuitry on device 10 holds signals ADD_IN (FIG. 3) at Vss, so that signals ADD are at Vss at time t3. As a result, address transistors 132 in memory elements 20 are all off at time t3.

Device 10 enters clear mode at time t3. At time t3, signal CLR is taken high to Vcc. Power supply voltage Vccadd remains at voltage Vcc from time t3 to t4. Storage element power supply circuits 150 ramp power supply voltage Vcchx from ⅔ of Vth to Vcc. Because the signal CLR is high, ramping Vcchx to Vcc clears memory elements 20. In their cleared state, memory elements 20 produce output signals OUT that are low (Vss). At time t4, the array 88 is cleared.

Between time t4 and t5, device 10 transitions between clear mode and configuration mode. At time t4, control circuitry 168 (FIG. 5) takes signals WC1 and WC2 low, thereby turning on switch circuit 173. With switch circuit 173 on, the Vcc power supply pin that supplies voltage Vcc to terminal 164 of FIG. 5 is electrically connected to output line 154. This ensures that the power supply voltage Vcchx will be able to maintain voltage Vcc even when exposed to large currents that are produced during data loading operations in which many memory elements 20 are loaded at the same time. Control circuitry 192 of FIG. 6 holds WC1_A and WC2_A high, so switch circuit 206 of FIG. 6 is off. The address power supply circuit 156 ramps address power supply voltage Vccadd from Vcc to Vh in preparation for data loading operations.

At time t5, device 10 enters configuration mode. Between time t5 and time t6, configuration data is loaded into memory elements 20 over data lines 108 while appropriate address signals ADD are asserted to address the columns of array 88. During configuration mode, Vcchx is held at Vcc through switch circuit 173 (FIG. 5) and Vccadd is held at Vh by circuitry 156.

Between times t6 and t7, device 10 transitions between configuration mode and user mode. At time t6, signals WC1 and WC2 are taken high, turning off switch circuit 173. With switch circuit 173 turned off, power supply voltage Vcchx is provided by the output of control circuitry 174 at node 182 (FIG. 5). Between t6 and t7, control circuitry 168 increases VREF, so that the magnitude of Vcchx ramps from Vcc to Vh. Control circuitry 192 lowers VREF_A so that Vccadd is lowered from Vh to Vcc. At time t7, control circuitry 192 takes control signals WC1_A and WC2_A low, thereby turning on switch circuit 206 and connecting output line 158 to the power supply pin that is used to supply power supply voltage Vcc to terminal 186. Switch circuit 206 provides the current needed to drive parasitic capacitances associated with address lines 112 during user mode. If desired, switch circuit 206 may also be turned on between times t3 and t4 to supply current to the address power supply voltage line during clear mode.

At time t7, device 10 enters user mode (normal operation of device 10 as a configured logic circuit in a system). During user mode operations between times t7 and t8, input and output data signals are conveyed through input-output pins 14. The programmable logic 18 on device 10 that has been configured in accordance with the configuration data that was loaded into array 88 during the data loading operations between times t5 and t6 is used to perform custom logic functions on the data signals.

If it is desired to reconfigure device 10 without removing device 10 from a system, an in-system reconfiguration operation may be performed by looping back to clear mode (time t3). At time t8, in preparation for returning to time t3, signals WC1_A and WC2_A are taken high so that between times t5 and t6 Vccadd can be taken high to Vh by address power supply circuit 156. When returning to time t3 from time t8, power supply voltage Vcchx is held at about ⅔ of Vth to prevent latchup and Vccadd remains at Vcc.

The foregoing is merely illustrative of the principles of this invention and various modifications can be made by those skilled in the art without departing from the scope and spirit of the invention.

What is claimed is:

1. A programmable logic device integrated circuit comprising:

an array of programmable memory elements that is divided into at least two subarrays, wherein each programmable memory element has a storage element formed from cross-coupled inverters, wherein each of the cross-coupled inverters receives a ground voltage;

programmable logic that is configured by configuration data loaded into the programmable memory elements; and at least two storage element power supply voltage circuits each of which supplies a separate storage element power supply voltage to a respective one of the subarrays for powering the storage elements in the programmable memory elements of that subarray, wherein each storage element power supply voltage circuit is operable to supply its separate storage element power supply voltage at a first voltage that is different from the ground voltage during configuration operations when the configuration data is being loaded into the programmable memory elements and at a second voltage that is greater than the first voltage during normal operations when the programmable logic is configured by the configuration data loaded into the programmable memory elements.

2. A programmable logic device integrated circuit comprising:
- an array of programmable memory elements that is divided into at least two subarrays, wherein each programmable memory element has a storage element formed from cross-coupled inverters;
- programmable logic that is configured by configuration data loaded into the programmable memory elements;
- at least two storage element power supply voltage circuits each of which supplies a separate storage element power supply voltage to a respective one of the subarrays for powering the storage elements in the programmable memory elements of that subarray, wherein each programmable memory element comprises at least one address transistor;
- address drivers that supply address signals to the address transistors; and
- an address power supply voltage circuit that supplies a time-varying address power supply voltage to the address drivers.

3. A programmable logic device integrated circuit comprising:
- an array of programmable memory elements that is divided into at least two subarrays, wherein each programmable memory element has a storage element formed from cross-coupled inverters;
- programmable logic that is configured by configuration data loaded into the programmable memory elements;
- at least two storage element power supply voltage circuits each of which supplies a separate storage element power supply voltage to a respective one of the subarrays for powering the storage elements in the programmable memory elements of that subarray, wherein each programmable memory element comprises at least one address transistor;
- address drivers that supply address signals to the address transistors;
- an address power supply voltage circuit that supplies a time-varying address power supply voltage to the address drivers;
- a bandgap voltage reference that supplies a bandgap reference voltage; and
- a plurality of unity gain buffers that receive the bandgap reference voltage and that supply a strengthened version of the bandgap reference voltage to at least some of the storage element power supply voltage circuits.

* * * * *